(12) United States Patent
Chandrakasan et al.

(10) Patent No.: US 7,746,713 B2
(45) Date of Patent: Jun. 29, 2010

(54) HIGH DENSITY 45 NM SRAM USING SMALL-SIGNAL NON-STROBED REGENERATIVE SENSING

(75) Inventors: Anantha P. Chandrakasan, Belmont, MA (US); Naveen Verma, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 156 days.

(21) Appl. No.: 12/105,410

(22) Filed: Apr. 18, 2008

(65) Prior Publication Data

US 2009/0067221 A1   Mar. 12, 2009

Related U.S. Application Data

(60) Provisional application No. 60/971,759, filed on Sep. 12, 2007.

(51) Int. Cl.
G11C 7/00  (2006.01)
(52) U.S. Cl. .................. 365/205; 365/156; 365/202
(58) Field of Classification Search .......... 365/154, 365/156, 205, 207, 202, 203, 230.05
See application file for complete search history.

(56) References Cited

U.S. PATENT DOCUMENTS

| | | | | |
|---|---|---|---|---|
| 5,237,533 | A * | 8/1993 | Papaliolios | 365/145 |
| 5,548,146 | A * | 8/1996 | Kuroda et al. | 257/321 |
| 6,519,204 | B2 * | 2/2003 | Slamowitz et al. | 365/230.05 |
| 6,903,996 | B2 * | 6/2005 | Slamowitz et al. | 365/230.05 |
| 6,987,686 | B2 * | 1/2006 | Kim et al. | 365/78 |
| 7,251,175 | B2 * | 7/2007 | Slamowitz et al. | 365/207 |
| 2003/0095431 | A1 | 5/2003 | Khalid | |

FOREIGN PATENT DOCUMENTS

| | | |
|---|---|---|
| EP | 1204121 | 5/2002 |
| JP | 06314490 | 11/1994 |

OTHER PUBLICATIONS

Verma et al., "A High-Density 45nm Sram Using Small-Signal Non-Strobed Regenerative Sensing" 2008 IEEE International Solid State Circuits Conference, pp. 380-381, 621.

Tang et al., "A 60MHz 0.7mv-Resolution CMOS Comparator" 1996 IEEE, pp. 279-282.

Bruccoleri et al., "Offset reduction technique for use with high speed CMOS comparators" Electronics Letters, Jun. 20, 1996, vol. 32, No. 13, pp. 1193-1194.

Sohn et al., "An Autonomous SRAM with On-Chip Sensors in 80nm Double Stacked Cell Technology" 2005 Symposium on VLSI Circuits Digest of Technical Papers, pp. 232-235.

Singh et al., "An Offset Compensation Technique for Latch Type Sense Amplifiers in High Speed Low Power SRAMS" IEEE Transactions on Very Large Scale Integration Systems, vol. 12, No. 6, Jun. 2004.

(Continued)

*Primary Examiner*—Gene N. Auduong
(74) *Attorney, Agent, or Firm*—Gauthier & Connors LLP

(57) ABSTRACT

A memory device includes a plurality of cells comprising CMOS structures. A non-strobed regenerative sense-amplifier (NSR-SA) is coupled to the cells and employs offset compensation and avoids strobe timing uncertainty to increase read-access speeds.

20 Claims, 5 Drawing Sheets

OTHER PUBLICATIONS

Sim et al., "A 1.0V 256Mb SDRAM with Offset-Compensated Direct Sensing and Charge-Recycled Precharge Schemes" 2003 IEEE International Solid-State Circuits Conference, 17.6, pp. 0-7803-7707.

Osada et al., "Universal-Vdd 0.65-2.0V 32kB Cache using Voltage-Adapted Timing-Generation Scheme and a Lithographical-Symmetric Cell" IEEE International Solid-State Circuits Conference, pp. 0-7803-6608-5.

* cited by examiner

HIGH DENSITY 45 NM SRAM USING SMALL-SIGNAL NON-STROBED REGENERATIVE SENSING

PRIORITY INFORMATION

This application claims priority from provisional application Ser. No. 60/971,759 filed Sep. 12, 2007, which is incorporated herein by reference in its entirety.

BACKGROUND OF THE INVENTION

The invention is related to the field of memory device, and in particular to a high density 45 nm SRAM using small-signal non-strobed regenerative sensing.

High-density SRAMs are a primary enabler of the dramatic cost reductions and expanding features benefiting ICs every technology node. Unfortunately, their small bit-cell devices have large variation, and the ensuing degradation in both $I_{READ}$ and read SNM must be addressed simultaneously. Similarly, variation severely affects sense-amplifier (SA) performance, as offset voltage and strobe timing uncertainty are dominating limitations.

SUMMARY OF THE INVENTION

According to one aspect of the invention, there is provided a memory device. The memory device includes a plurality of cells comprising CMOS structures. A non-strobed regenerative sense-amplifier (NSR-SA) is coupled to the cells and employs offset compensation and avoids strobe timing uncertainty to increase read-access speeds.

According to another aspect of the invention, there is provided a method of forming memory device. The method includes providing a plurality of cells comprising CMOS structures. Also, the method includes forming a non-strobed regenerative sense-amplifier (NSR-SA) being coupled to the cells and employing offset compensation and avoids strobe timing uncertainty to increase read-access speeds.

DETAILED DESCRIPTION OF THE INVENTION

The invention provides a 45 nm SRAM with low-power 0.25 μm² bit-cells and uses an offset compensating non-strobed regenerative sense-amplifier (NSR-SA); this eliminates the need to insert timing margin for variation and tracking errors in the strobe signal, and it achieves higher sensitivity than conventional SAs, allowing read SNM to be optimized at the cost of $I_{READ}$.

Figure 1:
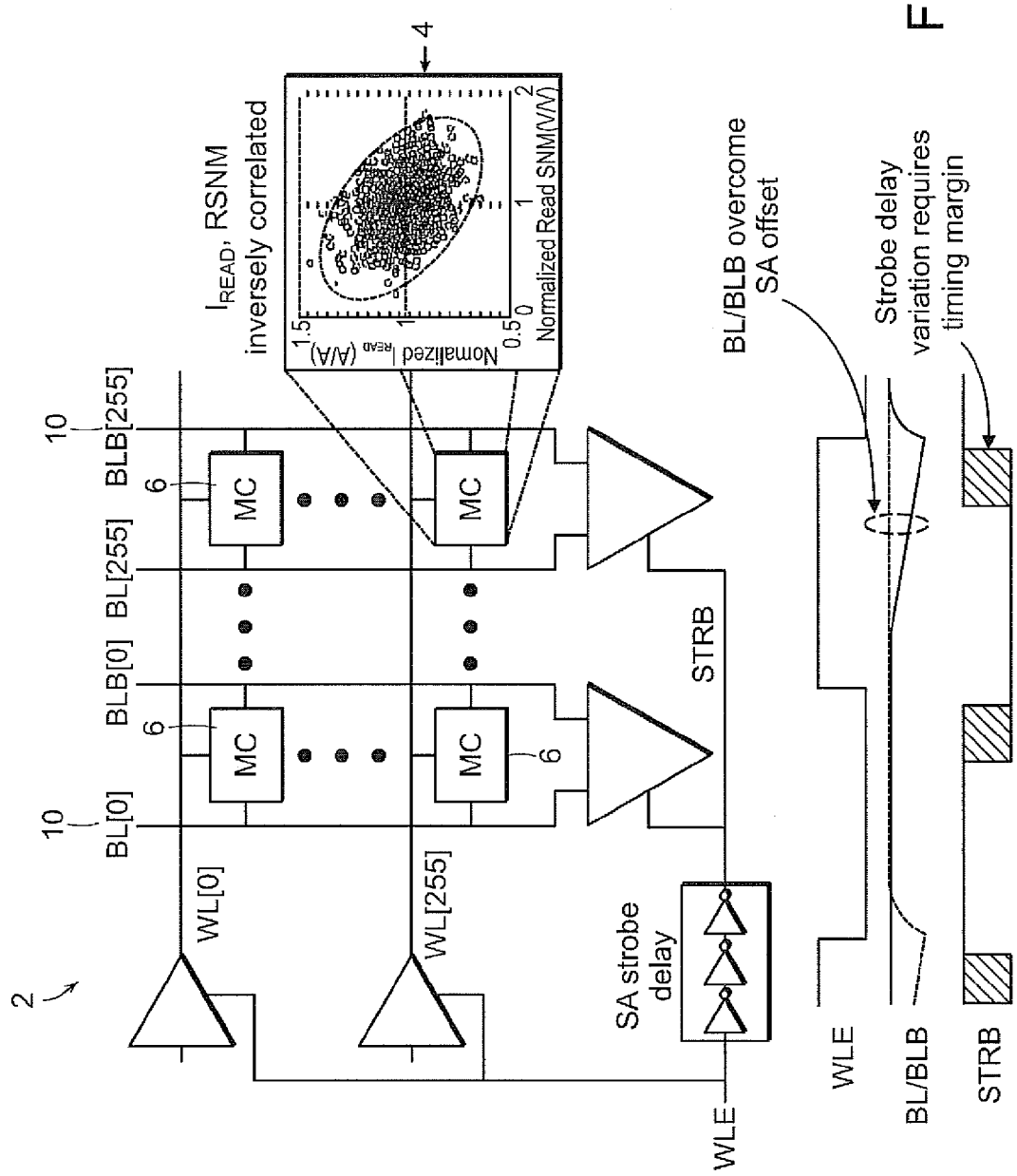
FIG. 1 is a schematic diagram illustrating SRAM read-access path showing $I_{READ}$-read SNM limitation and sensing amplifier (SA) strobe timing uncertainty.

FIG. 1 underlines the trade-offs plaguing high-density SRAMs 2. The scatter plot 4 shows an inverse correlation between $I_{READ}$ and read SNM 4 for the 6T cell 6 used. Extreme variation in 0.25 μm² cells 6 causes both to be severely degraded, but the foremost concern of vanishing read SNM 4 requires aggressive stability assists, usually reducing $I_{READ}$ even further. Accordingly, BL/BLB discharge, to exceed the SA offset, which itself is prominently affected by variation, dominates the access time. Further, timing variation in the strobe delay circuit, and its poor tracking of the array read-path across operating corners, is emerging as a significant source of uncertainty requiring 100-200 ps of additional margin. Although full-swing sensing avoids offset and timing limitations, it's impractical for high-density SRAMs, where $I_{READ}$ is very low and BL/BLB capacitance is very high with up to 256 cells/column 10.

Figure 2:
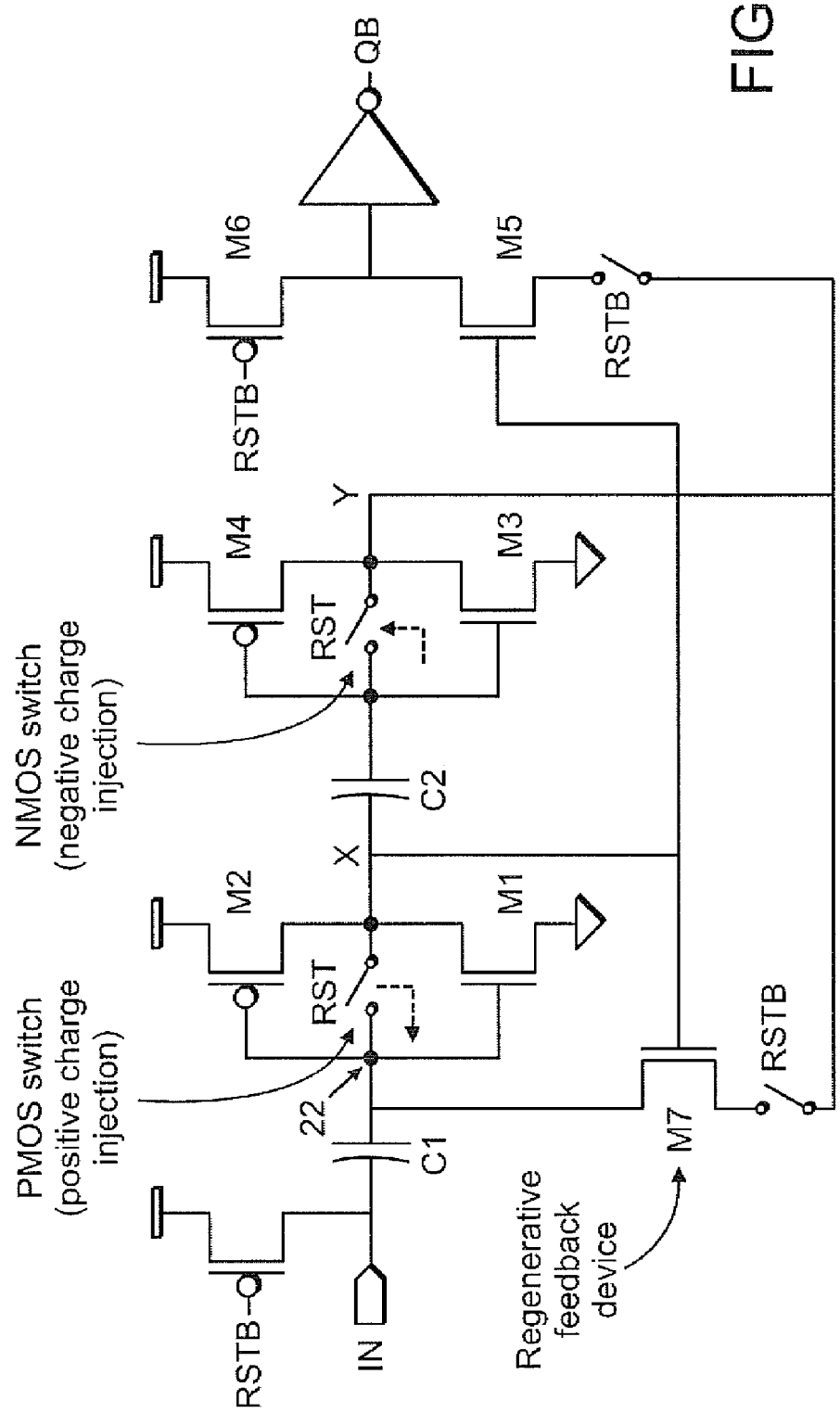
FIG. 2 is a schematic diagram illustrating a non-strobed regenerative sense-amplifier (NSR-SA) circuit.

The NSR-SA 20 of FIG. 2 overcomes these challenges, giving a measured reduction of up to 34% in read access-time: simple offset compensation imposes negligible loading on high-speed nodes and minimizes sensitivity to variation; continuous sensing after reset precludes the strobe signal and its timing uncertainty; single-sided regeneration efficiently provides high sensitivity but only responds to bit-line discharge, ensuring robustness against noise sources causing false regeneration; and single-ended operation allows use with asymmetric cells (8T, 6T), whose improved stability is gaining popularity at advanced CMOS nodes. Importantly, the NSR-SA 20 is based on nearly minimum sized inverters M1-M6, so its delay and area scaling follow logic trends more closely than conventional SAs.

Figure 3:
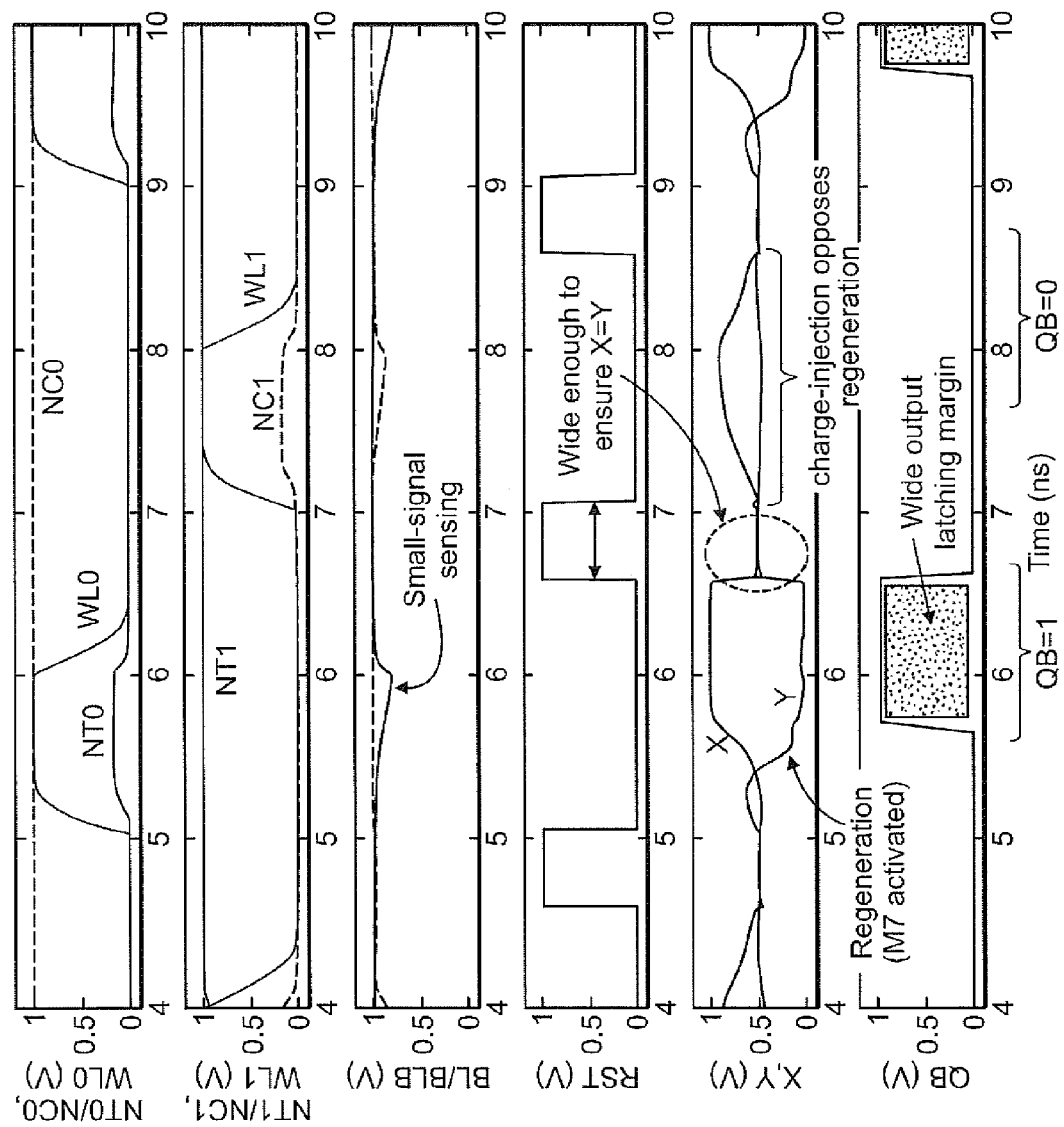
FIG. 3 illustrates NSR-SA simulated waveforms showing sensing of both data states (slow process, low voltage condition)

During BL/BLB precharge, RST, in FIG. 2, is asserted, and the inverters formed by M1-M4, are reset to their high-gain regions. Note RSTB is not asserted. Subsequently, as shown in FIG. 3, when RST is de-asserted, nodes X/Y remain approximately equal. Accordingly, the $V_{GS}$ of the positive feedback device, a regenerative device M7, is less than or nearly zero, and the device is off. After WL assertion, if no BL discharge is detected, all node voltages remain unchanged.

Alternatively, small discharge causes rapid increase in X and even more rapid decrease in Y due to the inverter gains. Eventually, M7 is turned on by its increasing $V_{GS}$, triggering positive feedback; the first inverter input 22 is actively pulled low, causing X/Y to sharply regenerate (in <100 ps), as shown in FIG. 3. The strong resulting overdrive on M5 quickly causes the output state, QB, to change. As noted, regeneration is triggered by the input signal itself, not an explicit strobe signal.

The goal of offset compensation is to set the amount of BL discharge required to flip the output state and diminish its sensitivity to variation. The reset X/Y voltages set $V_{GS, M7}$ after reset and therefore determine how much additional BL discharge triggers regeneration. Their values are chosen, based on speed and noise-rejection considerations, by setting the M1/M2 and M3/M4 strength ratios (i.e. inverter trip-points). In practice, the actual voltages get skewed by variation, which can be modeled as a voltage error in series with the input; however, during reset, negative feedback forces each inverter to its nominal trip-point minus that input offset. This voltage is stored on C1 or C2, and, now, since the negative of each offset effectively appears in series with the true input offset, the transfer functions from IN-X and X-Y are nearly ideal. Only the offset of M7 remains; however, when input-referred, its effect is reduced by a factor of $[g_m r_o + (g_m r_o)^2]$, the input gain to $V_{GS,M7}$ ($g_m$ and $r_o$ are the transconductance and output-resistance of M1-M4.

Figure 4:
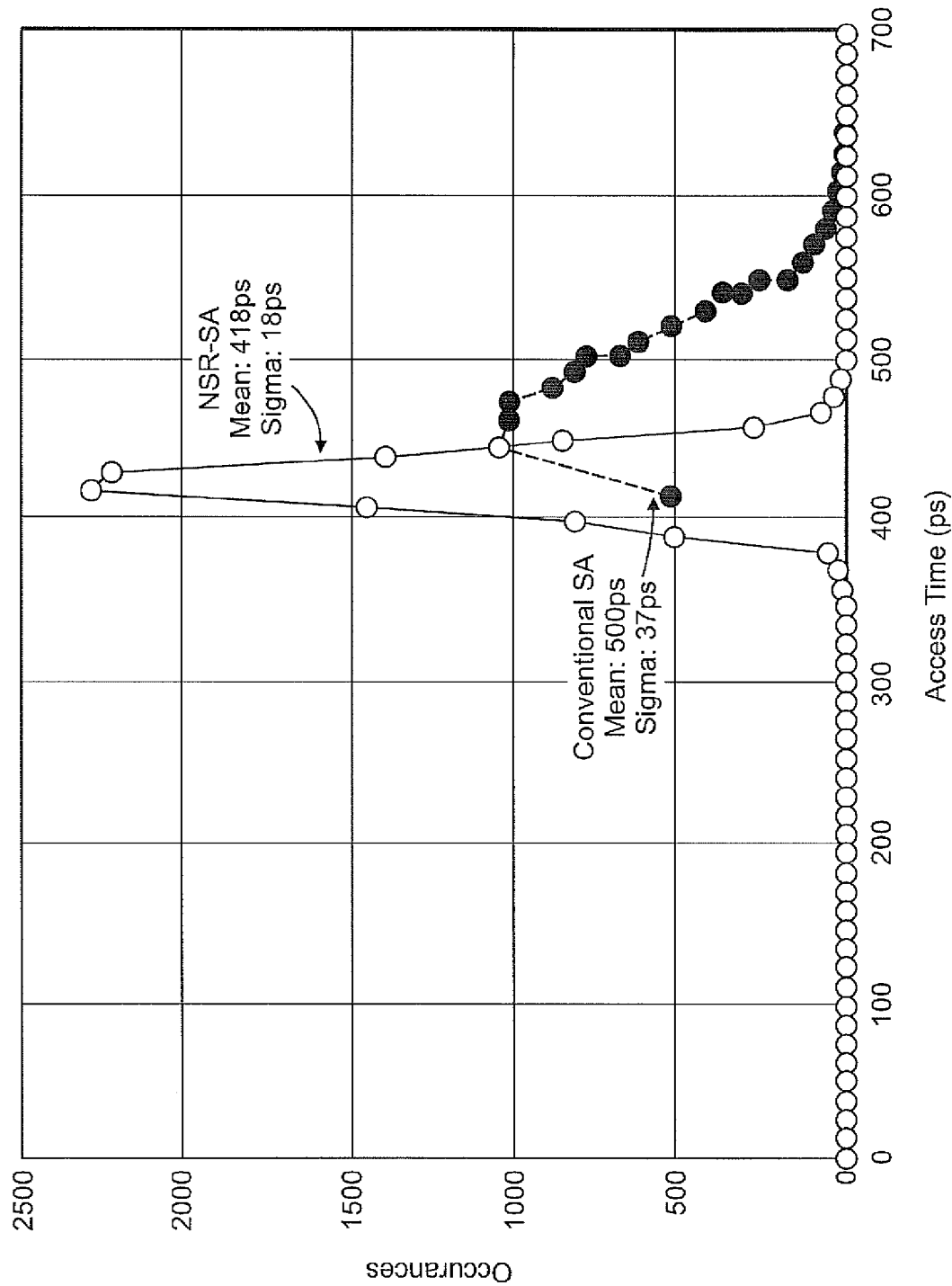
FIG. 4 is a graph illustrating simulated access-time distributions for conventional SA and NSR-SA.

The benefit of offset compensation and non-strobed sensing is shown in the simulated distributions of FIG. 4. Being differential, the conventional SA nominally requires very little BL/BLB discharge and, therefore, achieves good mean/mode access-time. With variation, however, the NSR-SA has far superior sigma, and it's free from the 150 ps of strobe timing margin that, in simulations, the conventional SA requires. Its 3σ access-time, for the considered 256×256 array with mean bit-cells, is 486 ps compared to 610 ps for the conventional SA, representing a speed-up of over 20%.

A residual source of error is false regeneration due to charge-injection (C-I) from the reset switches. However, the NSR-SA, exploits the fact that it must only respond to BL discharge, not up-charge. Specifically, it only regenerates when node X increases and node Y decreases. So, the reset switches are implemented as indicated in FIG. 2, where a PMOS switch's C-I causes M1-M2's gate voltage to increase, while an NMOS switch's C-I causes M3-M4's gate voltage to decrease. The resulting voltage errors cause X/Y to oppose regeneration.

The fabricated prototype test chip contains 256×256 arrays of high-density, low-power 0.25 $\mu m^2$ cells to allow comparison of the NSR-SA against a conventional SA. To evaluate the trade-off between sensitivity and noise rejection, which is fundamental to single-ended sensing, a circuit that injects a controlled voltage noise on BL/BLB via capacitive coupling is also incorporated.

Figure 5:
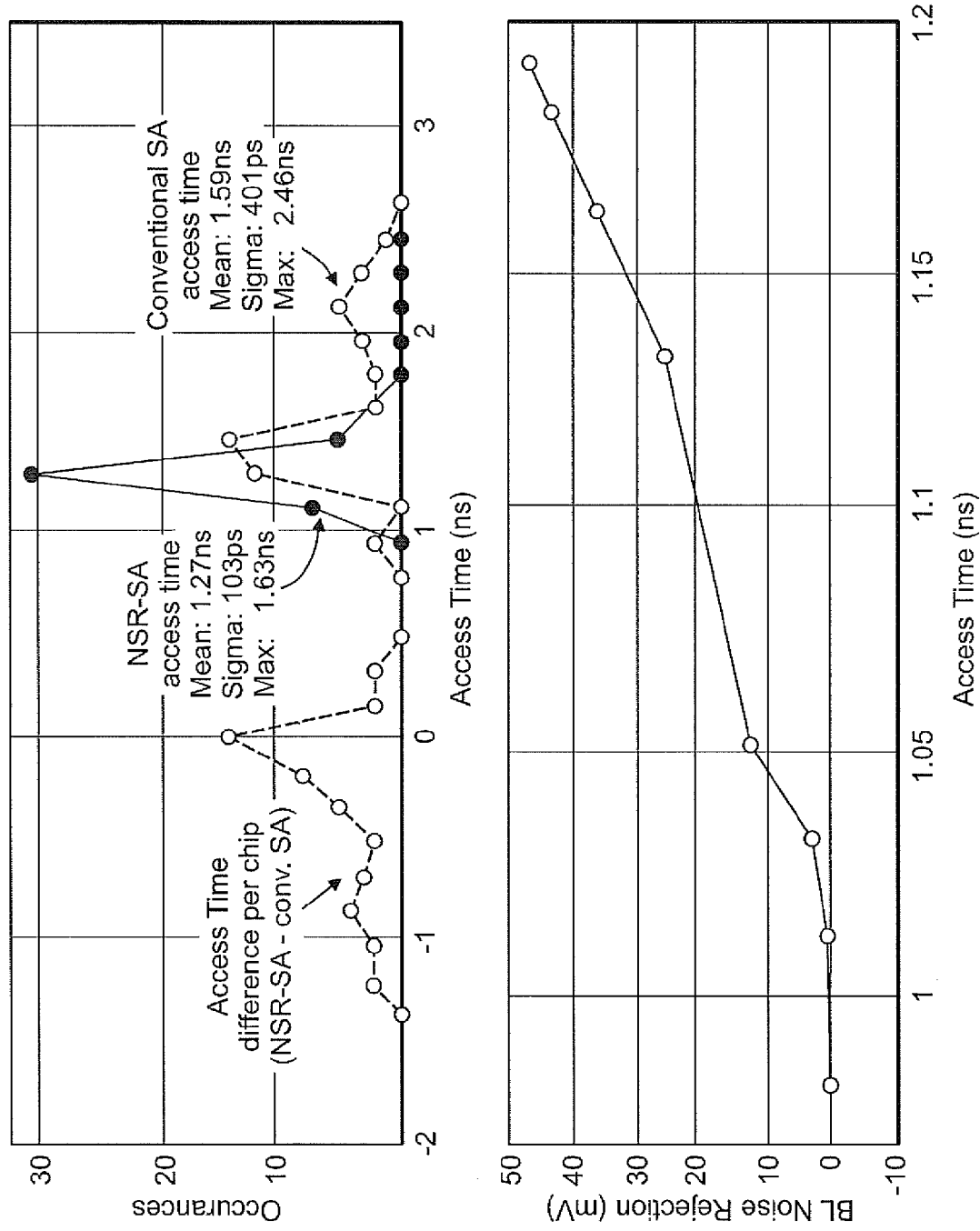
FIG. 5 is a graph illustrating measured access times and noise rejection of the NSR-SA.

The measured access-time (WLE-CLKIN) distributions from 53 chips are shown in FIG. 5. Since the strobe signal is generated off-chip, its variation is not considered. Still, the access-time differences show that the NSR-SA offers a speed-up of up to 34%, and a mean speed-up of 20%, even without the additional timing margin required by the conventional SA. Further, as expected, the conventional SA achieves reasonable mean performance, but the NSR-SA has superior sigma, confirming the benefit of offset-compensation.

Each NSR-SA occupies 15 $\mu m^2$, approximately equal to the conventional SA. The NSR-SA's measured speed can be increased by adjusting the reset X/Y voltages at the cost of BL noise rejection. Finally, the power per NSR-SA in reset is measured to be 23 μW, and it increases the total array power by 8% when operating at 100 MHz.

It is established that the invention can be integrated with static random access memory in particular 45 nm, however, the invention can actually be beneficial for other forms of memory devices, such as dynamic random access memory, flash memory, or certainly for SRAMs at other technology nodes in addition to 45 nm.

Although the present invention has been shown and described with respect to several preferred embodiments thereof, various changes, omissions and additions to the form and detail thereof, may be made therein, without departing from the spirit and scope of the invention.

What is claimed is:

1. A memory device comprising:
    a plurality of bit-cells comprising CMOS structures; and
    a non-strobed regenerative sense-amplifier (NSR-SA) being coupled to said bit-cells and employing offset compensation and avoiding strobe timing uncertainty to increase read-access speeds, the NSR-SA having a cascade of two inverter structures and a feedback transistor structure wherein once a discharge is detected on the bit-lines, the feedback transistor structure is activated due to an increase in its gate to source voltage, which in turn triggers positive feedback, and the input of the first inverter structures is pulled low, causing regeneration.

2. The memory device of claim 1, wherein said CMOS structures comprise low-power 0.25 $\mu m^2$ bit-cells.

3. The memory device of claim 1, wherein said NSR-SA allows the read static noise margin (SNM) of a bit-cell to be optimized at the cost of $I_{READ}$ through sizing of the bit-cell transistors.

4. The memory device of claim 1, wherein said memory device comprises a SRAM structure having a critical length of 45 nm.

5. The memory device of claim 1, wherein said NSR-SA comprises an area of 15 $\mu m^2$.

6. The memory device of claim 1, wherein said NSR-SA comprises a power of at most 23 μW.

7. The memory device of claim 1, wherein said NSR-SA comprises a positive feedback transistor structure.

8. The memory device of claim 7, wherein said feedback transistor structure comprise a gate to source voltage of nearly zero when said NSR-SA experiences BL/BLB precharge.

9. The memory device of claim 7, wherein said feedback transistor structure triggers feedback as well as increasing the gate to source voltage of the feedback transistor structure when a discharge is experienced.

10. The memory device of claim 1, wherein said cells comprise 256×256 array of bit-cells.

11. A method of forming memory device comprising:
    providing a plurality of bit-cells comprising CMOS structures; and
    forming a non-strobed regenerative sense-amplifier (NSR-SA) being coupled to said bit-cells and employing offset compensation and avoids strobe timing uncertainty to increase read-access speeds, the NSR-SA having a cascade of two inverter structures and a feedback transistor structure wherein once a discharge is detected on the bit-lines, the feedback transistor structure is activated due to an increase in its gate to source voltage which in turn triggers positive feedback, and the input of the first inverter structures is pulled low, causing regeneration.

12. The method of claim 11, wherein said CMOS structures comprise low-power 0.25 $\mu m^2$ bit-cells.

13. The method of claim 11, wherein said NSR-SA allows the read static noise margin (SNM) of the bit-cells to be optimized at the cost of $I_{READ}$ through sizing of the bit-cell transistors.

14. The method of claim 11, wherein said memory device comprises a SRAM structure having a critical length of 45 mn.

15. The method of claim 11, wherein said NSR-SA comprises an area of 15 $\mu m^2$.

16. The method of claim 11, wherein said NSR-SA comprises a power of at most 23 μW.

17. The method of claim 11, wherein said NSR-SA comprises a positive feedback transistor structure.

18. The method of claim 17, wherein said feedback transistor structure comprise a gate to source voltage of nearly zero when said NSR-SA experiences BL/BLB precharge.

19. The method of claim 17, wherein said feedback transistor structure triggers feedback as well as increasing the gate to source voltage of the feedback transistor structure when a discharge is experienced.

20. The method of claim 11, wherein said cells comprise 256×256 array of bit-cells.

* * * * *